United States Patent
Meijer et al.

(10) Patent No.: US 10,157,814 B1
(45) Date of Patent: Dec. 18, 2018

(54) COMPLIANT HEAT SINK

(71) Applicant: International Business Machines Corporation, Armonk, NY (US)

(72) Inventors: Gerhard I. Meijer, Zurich (CH); Gerd Schlottig, Uitkon Waldegg (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/633,977

(22) Filed: Jun. 27, 2017

(51) Int. Cl.
*H01L 23/367* (2006.01)
*H01L 23/427* (2006.01)

(52) U.S. Cl.
CPC ...... *H01L 23/3672* (2013.01); *H01L 23/3677* (2013.01); *H01L 23/427* (2013.01); *H01L 2224/73253* (2013.01)

(58) Field of Classification Search
CPC ............ H01L 23/3672; H01L 23/3677; H01L 23/427; H01L 2224/73253
See application file for complete search history.

(56) References Cited

U.S. PATENT DOCUMENTS

| | | | |
|---|---|---|---|
| 5,168,348 A | 12/1992 | Chu et al. | |
| 5,323,292 A | 6/1994 | Brzezinski | |
| 5,549,835 A * | 8/1996 | Uematsu | C10M 131/08 508/204 |
| 5,653,280 A | 8/1997 | Porter | |
| 5,956,226 A | 9/1999 | Jung et al. | |
| 5,981,310 A | 11/1999 | DiGiacomo et al. | |
| 6,282,096 B1 * | 8/2001 | Lo | H01L 23/04 165/185 |
| 6,373,133 B1 | 4/2002 | DiGiacomo et al. | |
| 6,552,560 B2 | 4/2003 | Melgaard et al. | |
| 6,639,801 B2 | 10/2003 | Miner | |
| 6,639,803 B1 | 10/2003 | Corrado et al. | |
| 6,714,416 B1 | 3/2004 | McLeod et al. | |
| 6,831,679 B1 | 12/2004 | Olsson et al. | |
| 7,561,425 B2 | 7/2009 | Mindock et al. | |
| 7,849,914 B2 | 12/2010 | Di Stefano et al. | |
| 7,995,344 B2 | 8/2011 | Dando, III et al. | |
| 8,053,700 B2 | 11/2011 | Schuss et al. | |
| 8,273,114 B2 | 9/2012 | Wasowski | |
| 8,297,342 B2 | 10/2012 | Schultz | |
| 8,368,208 B2 | 2/2013 | Johnson et al. | |

(Continued)

OTHER PUBLICATIONS

"Technical Information—Cooling multiple heat sources with a single heat sink", ALPHA Next Generation Heat Sinks, 2 pages, printed on Jun. 7, 2017, © 2012 Alpha Novatech, Inc., <https://www.micforg.co.jp/en/multiplee.html>.

*Primary Examiner* — Allan R Wilson
(74) *Attorney, Agent, or Firm* — Tihon Poltavets

(57) ABSTRACT

A compliant heat sink for transporting heat away from at least one electronic component, the heat sink includes a body, where the body includes a flexible element thermally contacting at least one electronic component. The heat sink further includes a cavity located in the body, where the cavity is at least partially covered by the flexible element. The heat sink further includes a raised member of the body coupled to the flexible element, where a portion of the raised member partially extends into the cavity. The heat sink further includes a guiding structure of the body coupled in the cavity of the body, wherein the guiding structure is adapted for guiding the movement of the raised member in a moving direction.

16 Claims, 3 Drawing Sheets

(56) References Cited

U.S. PATENT DOCUMENTS

| | | |
|---|---|---|
| 8,382,509 B2 | 2/2013 | David et al. |
| 8,736,048 B2 | 5/2014 | Schultz |
| 8,779,582 B2 | 7/2014 | Lin et al. |
| 9,425,124 B2 | 8/2016 | Karidis et al. |
| 2001/0039439 A1 | 11/2001 | Elkins et al. |
| 2002/0135389 A1 | 9/2002 | Melgaard et al. |
| 2003/0030983 A1 | 2/2003 | Miner |
| 2004/0042184 A1* | 3/2004 | Tomioka ............... G06F 1/203 361/752 |
| 2007/0079935 A1 | 4/2007 | Schuss et al. |
| 2007/0256810 A1 | 11/2007 | Di Stefano et al. |
| 2007/0285892 A1 | 12/2007 | Mindock et al. |
| 2008/0077126 A1 | 3/2008 | Rashidi |
| 2008/0234788 A1 | 9/2008 | Wasowski |
| 2009/0008771 A1* | 1/2009 | Torii ................... H01L 23/3675 257/713 |
| 2009/0151893 A1 | 6/2009 | Karidis et al. |
| 2009/0151907 A1 | 6/2009 | Karidis et al. |
| 2010/0059201 A1 | 3/2010 | Masto et al. |
| 2010/0179537 A1 | 7/2010 | Rashidi |
| 2010/0200197 A1 | 8/2010 | Bezama et al. |
| 2010/0326626 A1 | 12/2010 | Schultz |
| 2011/0189525 A1 | 8/2011 | Palanchon et al. |
| 2012/0052720 A1 | 3/2012 | David et al. |
| 2013/0021752 A1* | 1/2013 | Campbell ............. H05K 13/00 361/700 |
| 2013/0079854 A1 | 3/2013 | Wasowski |
| 2013/0199767 A1 | 8/2013 | Karidis et al. |
| 2013/0214406 A1 | 8/2013 | Schultz |
| 2013/0244077 A1 | 9/2013 | Palanchon et al. |
| 2014/0017545 A1 | 1/2014 | Palanchon |
| 2014/0071628 A1* | 3/2014 | Brunschwiler ....... H01L 23/367 361/700 |
| 2014/0360698 A1 | 12/2014 | Waldman et al. |
| 2015/0114611 A1 | 4/2015 | Morris et al. |
| 2016/0064306 A1 | 3/2016 | Bezama et al. |
| 2016/0091260 A1 | 3/2016 | Schultz |
| 2016/0290728 A1 | 10/2016 | Coteus et al. |
| 2016/0300780 A1 | 10/2016 | Bezama et al. |
| 2017/0038154 A1* | 2/2017 | Wang ................... F28D 15/046 |

* cited by examiner

US 10,157,814 B1

COMPLIANT HEAT SINK

FIELD OF THE INVENTION

The present invention relates to cooling of electronic components, and more specifically to cooling of microchips.

BACKGROUND

Electronic devices generate heat during operation. High performance integrated circuits such as computer processors containing nanometer scaled structures are among the electronic devices that are most sensitive to heat. Subject to the available cooling power, these components and devices are operated within certain boundaries of operational parameters such as voltage, clocking frequency, and idle time, which are known as the thermal envelope of the electronic device.

Integrated circuits are commonly manufactured on thin, flat, semiconductor dice mounted in a package. Heat generated in the die is transported through the package into, for example, ambient air or a liquid coolant. In practice, a semiconductor die is not perfectly flat, but has a slightly curved or warped (e.g., convex) surface.

Semiconductor dice are often manufactured with standardized sizes, for example, 20×20 mm. It is expected that dice for future high-end applications such as servers in a data center will be made with larger dimensions than are usual today. Another recent development is the use of packages comprising vertically stacked chips. Both developments increase the vertical amplitude of a non-uniform cooling surface of an electronic device.

SUMMARY

One aspect of an embodiment of the present invention discloses a compliant heat sink for transporting heat away from at least one electronic component, the heat sink comprising, a body, wherein the body includes a flexible element thermally contacting at least one electronic component, a cavity located in the body, wherein the cavity is at least partially covered by the flexible element, a raised member of the body coupled to the flexible element, wherein a portion of the raised member partially extends into the cavity, and a guiding structure of the body coupled in the cavity of the body, wherein the guiding structure is adapted for guiding the movement of the raised member in a moving direction.

BRIEF DESCRIPTION OF THE SEVERAL VIEWS OF THE DRAWINGS

The following detailed description, given by way of example and not intended to limit the disclosure solely thereto, will best be appreciated in conjunction with the accompanying drawings, in which.

DETAILED DESCRIPTION

It is an objective of the present invention to provide for an improved heat sink for transporting heat away from at least one electronic component and a cool-able electronics system as specified in the independent claims. Embodiments of the invention are given in the dependent claims. Embodiments of the present invention can be freely combined with each other if they are not mutually exclusive.

In one aspect, the invention relates to a compliant heat sink for transporting heat away from at least one electronic component. The heat sink comprises a body, a flexible element for thermally contacting the at least one electronic component, and a raised member. The body comprises a cavity, which is covered by the flexible element. The raised member is fixed to the flexible element and extends into the cavity. The body further comprises a guiding structure located in the cavity and adapted for guiding the movement of the raised member in a moving direction.

In a further aspect, the invention relates to a cool-able electronics system, which comprises at least one electronic component and the heat sink according to an embodiment of the invention. The heat sink is mounted on the at least one electronic component, which is thermally coupled to the heat sink by a full-area contact of the at least one electronic component to the flexible element.

The compliant heat sink 100 according to embodiments of the present invention may provide a strong and stable thermal coupling to sensitive electronic components with uneven, curved, warped or other non-uniform cooling surfaces. Sensitive electronic components require a cooling apparatus or heat sink to prevent overheating. Thermal coupling to a heat sink is often provided for an electronic component with a flat surface by means of a lidded package with a flat, rigid lid and one or more layers of a thermal interface material (TIM) to compensate unevenness on small scales. However, electronic components with a large area cannot be treated as approximately flat devices as they might exhibit unevenness on the scale of the cooling area. A rigid lid might provide thermal coupling to merely part of the cooling area of the component, resulting in inefficient cooling due to long cooling paths for part of the cooling area and unacceptable TIM thicknesses such that the thermal insulation of the TIM compared to the heat sink material outweighs the capability to increase heat conductivity by filling microscopic gaps.

Figure 1:
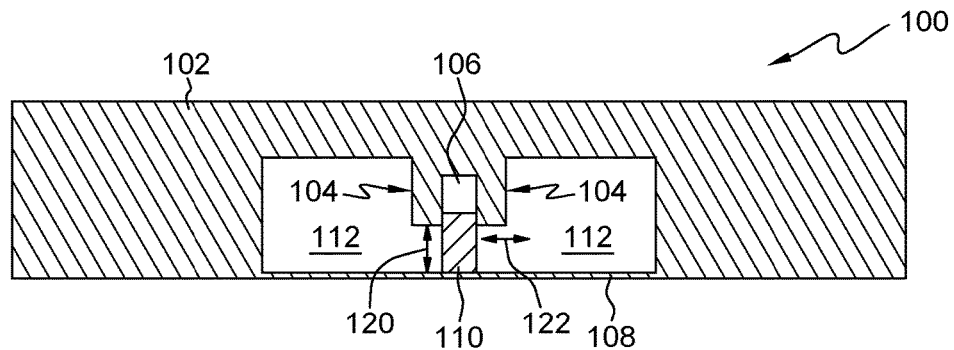
FIG. 1 depicts a schematic cut through a compliant heat sink, in accordance with an embodiment of the present invention.

FIG. 1 depicts a schematic cut through a compliant heat sink, in accordance with an embodiment of the present invention.

The largest part of heat sink 100 is formed by heat sink body 102, which is shown here with a basically rectangular contour. Cavity 112 is formed on the side of body 102, which is intended to face the electronic component to be cooled. Cavity 112 is closed with flexible element 108, which is fixed to body 102 along the rim of cavity 112. Cavity 112 is also shown with a basically rectangular structure. Body 102 in the center of cavity 112 on a cavity wall, which is facing flexible element 108, forms guiding structure 106. Raised member 110, also with a rectangular cross-section, is fixed to flexible element 108 in the center of cavity 112. Height and width of raised member 110 are chosen such that it extends sufficiently far into cavity 112 that guiding structure 106 receives raised member 110 and part of the lateral surfaces of raised member 110 are contacting guiding structure 106.

Raised member 110 and guiding structure 106 form a heat path from the center of flexible element 108 to body 102. Without raised member 110 and guiding structure 106, heat generated by an electronic component in thermal contact with flexible element 108 would be transported to body 102 through the thin flexible element 108 and possibly also by heat-conducting gas or vapor filled into cavity 112. Preferably, flexible element 108, raised member 110, and guiding structure 106 are made of materials with a high heat conductivity. Therefore, the additional heat path formed by raised member 110 and flexible element 108 in the center of cavity 112 may strongly increase heat transport away from the center of the electronic component.

All solid parts of compliant heat sink 100 according to embodiments of the invention are preferably made of materials with a high thermal conductivity. Although materials exist with a higher thermal conductivity, a cost-effective choice for the solid components of heat sink 100 are metals like aluminum or copper or metal alloys with a high thermal conductivity. More specific material choices for the single path will be discussed in the following.

As used herein, body 102 of compliant heat sink 100 according to embodiments of the invention is a piece of a rigid, heat conducting material which is large enough to host cavity 112 which is capable of covering a cooling area of a single electronic component or a footprint area of an arrangement of more than one electronic components to be cooled. Body 102 forms the mechanical framework of heat sink 100. In the depictions of FIGS. 1-7, the body consists of a thick plate for spreading and transporting the heat collected from the electronic components to a heat exchanger, and sidewalls of cavity 112 providing mechanical connectivity to a structure hosting the electronic component (e.g., a substrate or a circuit board).

Being the largest part of heat sink 100, it is preferably made of a material which offers a sufficient amount of heat conduction. Body 102 can be formed from a metal plate, the metal being one of aluminum and copper. Body 102 may be implemented with any shape which is suitable for the available space for mounting and for connecting it to further cooling equipment downstream of the heat transfer path, including, but not limited to, the basically rectangular cross-section shown in FIGS. 1-7.

In an embodiment, body 102 is thermally coupled to an air-cooling component for exchanging the heat with ambient air of heat sink 100. In another embodiment, body 102 is thermally coupled to a liquid cooling component for exchanging the heat with a heat transport liquid. Both cooling components may establish a continuous heat flow away from the one or more electronic components to be cooled, enabling it to operate in an allowable temperature range or thermal envelope.

On a side designed for facing the at least one electronic component, body 102 comprises cavity 112. In FIGS. 1-7, cavity 112 is located at the bottom of body 102, which corresponds to an application where the compliant heat sink 100 is installed above an electronic component that is mounted on a substrate or circuit board with a horizontal orientation. However, it is clear to those of ordinary skill in the art that the electronic component to be cooled may be likewise oriented in a vertical plane or in any other tilted or slanted direction as required by the particular installation. For the purpose of this disclosure, terms like 'horizontal', 'vertical', 'above', 'below', 'next to', 'left', 'right' etc. which describe absolute or relative spatial orientations or arrangements refer, unless otherwise noted, to the embodiments depicted in FIGS. 1-7, where heat sink 100 is oriented to face the at least one electronic component in a horizontal plane.

A main purpose of cavity 112 is to provide space perpendicular to a cooling surface of the electronic component, i.e., in the vertical direction of FIG. 1. The horizontal dimensions are chosen to slightly exceed the horizontal dimensions or footprint area of a particular model, class, series, or arrangement of electronic components. Vertically, cavity 112 dimensions should slightly exceed the largest expectable unevenness of the electronic component such that it provides enough vertical space for establishing a full area contact with the cooling surface of the electronic component without wasting thermal path length.

Cavity 112 may, for instance, be removed, e.g., by milling or cutting, from the bulk material of body 102 from bottom upward, such that guiding structure 106 can be formed as one piece with the rest of body 102 and cavity 112 is closed or sealed afterwards with flexible element 108, as shown e.g., in FIG. 1. Many other manufacturing processes can be apparently used to create body 102 with cavity 112. In particular, body 102 can be formed with cavity 112 in a single manufacturing step. If, for instance, body 102 is formed in a casting or molding process, designing the model accordingly can provide cavity 112.

Figure 2:
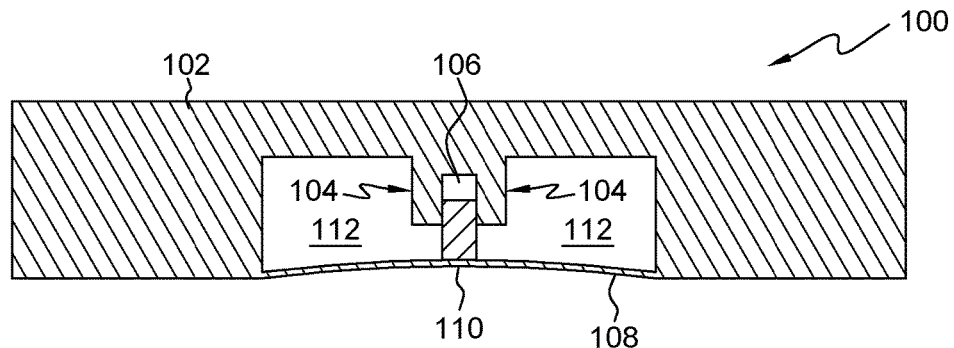
FIG. 2 depicts a schematic cut through a compliant heat sink, the flexible element being actuated, in accordance with an embodiment of the present invention.
Figure 3:
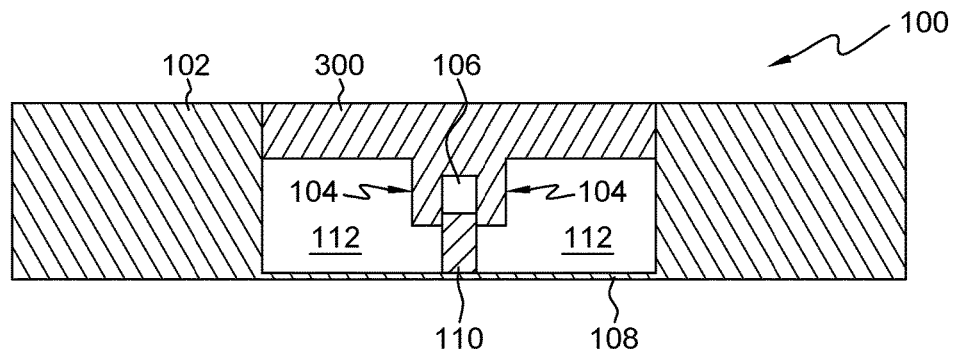
FIG. 3 depicts a schematic cut through a compliant heat sink, the guiding structure being part of an insert, in accordance with an embodiment of the present invention.

Alternatively, cavity 112 and most of the solid parts of heat sink 100 may be formed by removing material from a precursor of body 102 upside-down, such that flexible element 108 and raised member 110 are formed as one part with body 102 and guiding structure 106 is connected with body 102 to close cavity 112 as a separate piece afterwards, as shown in FIG. 3. For the purpose of description, cavity boundaries opposing flexible element 108 will herein be referred to as the 'ceiling' of cavity 112, whereas the lateral boundaries, as depicted in FIGS. 1-7, will be referred to as the 'sidewalls'. Cavity 112 may be open or closed with respect to ambient pressure.

Cavity 112 may be filled with a gas or vapor to provide additional thermal contact between body 102 and flexible element 108 besides the thermal path formed by the fixture of flexible element 108 to body 102 and raised member 110 contacting guiding structure 106. According to an embodiment, cavity 112 is filled with air, nitrogen, methanol vapor, ethanol vapor, or an arbitrary combination thereof. These materials may provide a means to achieve mentioned additional thermal coupling with sufficient heat transport performance. The cavity may be filled with any other gas typically used in vapor chambers.

Moreover, a gas or vapor filling of cavity 112 may provide a means for reacting to sudden temperature changes of the electronic component to be cooled. This may yield a quicker thermal response of the thermal expansion coefficient mismatched heat path formed by flexible element 108 and guiding structure 106, or alternatively, of an expansion layer 500 surrounding guiding structure 106, as will be explained in further detail below.

According to an embodiment of the invention, the pressure within cavity 112 exceeds an ambient air pressure of heat sink 100. The ambient air pressure may be atmospheric pressure or a pressure level of a pressurizing system, e.g., a cooling system, which is typically used to provide positive air pressure for a computing center. A pressurized cavity 112 may enable compliant heat sink 100 to form a full area of thermal contact with electronic components having a concave cooling surface.

Flexible element 108, as used herein, is a thin piece of a material with a high thermal conductivity. The dimensions are similar to those of the cavity opening, such that it can be fixed to body 102 to cover or seal cavity 112. Alternatively, flexible element 108 is a thin, flat section of body 102, which has been spared from forming cavity 112 in an upside-down process. In this case, the horizontal dimensions of flexible element 108 are identical to those of cavity 112. If implemented as a separate piece, flexible element 108 may be formed from a different material than body 102.

Flexible element 108 acts as a membrane, which is spanned under cavity 112. The main purposes are to provide a full area contact with a curved or other non-uniform cooling area of a heat-generating electronic component and to spread this heat across thickness into raised member 110 and cavity 112 and to transport the heat along the area towards the bulk of body 102. It provides the mechanical compliance, which is needed to collect the heat from all regions of the non-uniform surface with a high coupling efficiency.

According to an embodiment, flexible element 108 is made of a metal or metal alloy with a high thermal conductivity, such as an alloy based on Mg, Zn, or Al, copper, or alloys based on Si, SiC, or W. The thickness is optimized for responding elastically to the contact with the cooling surface of the electronic component. It should be thick enough that it will not get ruptured when force is applied to install heat sink 100 on the at least one electronic component, but it should be as thin as possible in order to minimize the force which is needed for installing in order to prevent damage from the electronic component.

In addition to these requirements, flexible element 108 should also bear the shear stress occurring in the region between the perimeter of the electronic component and the sidewalls of cavity 112. In typical and projected application scenarios, large electronic components like microchip dice have curvature amplitudes between 100 µm and 1 mm. Accordingly, suitable membrane thicknesses are expected to be in the range between 300 µm and 1.5 mm.

In order to maximize the thermal coupling efficiency between flexible element 108 and body 102, a firm metal-to-metal fixture should be used to fix flexible element 108, if implemented as a separate part, to body 102. A soldered, brazed or welded connection appears appropriate for this purpose.

FIG. 2 depicts a schematic cut through a compliant heat sink, the flexible element being actuated, in accordance with an embodiment of the present invention.

In this embodiment, compliant heat sink 100 of FIG. 1 includes flexible element 108 in an actuated state, i.e., during application of heat sink 100 to an electronic component (not shown) with a convexly curved cooling surface. The slightly pre-tensioned flexible element 108 adapts to the curved geometry of the cooling surface and gets bent into the cavity volume. Raised member 110 fixed to flexible element 108 at the center of cavity 112 is pushed upward and further into guiding structure 106. The contact surface between raised member 110 and guiding structure 106 thus becomes larger, yielding increased heat conductivity of the heat path formed by these two parts.

According to an embodiment, the coefficient of thermal expansion of flexible element 108 exceeds the coefficient of thermal expansion of body 102. During heat up of the at least one electronic component, heat is stored in the large heat capacity of body 102. The heat stored in body 102 causes body 102 to expand thermally, the thermal expansion being greatest in the largest dimension.

In the embodiments depicted in FIGS. 1-7, thermal expansion of body 102 is greatest in horizontal directions. As a result, the horizontal dimensions of cavity 112 increase slightly and the fixture of flexible element 108 moves away from the center. Hence, heating up heat sink 100 increases strain of flexible element 108, which may eventually lead to destruction. This effect may be compensated if flexible element 108 has a higher coefficient of thermal expansion than body 102. However, care should be taken that the difference in thermal expansion coefficients is not too large as this may cause flexible element 108 to release from the cooling surface of the electronic component.

As used herein, raised member 110 is a small piece of metal, which is fixed to the center of flexible element 108. The fixture is preferably of the same kind as that used for connecting flexible element 108 to body 102. Alternatively, raised member 110 and flexible element 108 are machined from the same part such that no connecting technology is needed. Flexible element 108 may be selected from the list of materials given for flexible element 108. Flexible element 108 may be formed from a different material than body 102, if not implemented as a single part. Preferably, raised member 110 is made of the same material as flexible element 108 to prevent thermal expansion of flexible element 108 relative to raised member 110.

Raised member 110 should match guiding structure 106 by width and should be tall enough to be received by guiding structure 106 when the flexible element 108 is in the maximum deflection from the ceiling of cavity 112. Upon actuation or relaxation of flexible element 108, raised member 110 is pushed into or pulled out of guiding structure 106 in moving direction 120 perpendicular to the substrate or circuit board to which the at least one electronic component is mounted. In FIGS. 1-7, moving direction 120 of raised member 110 is vertical. Raised member 110 is depicted with a rectangular cross-section in FIGS. 1-7, but it can be implemented with numerous different shapes as will be understood by those of ordinary skill in the art.

According to an embodiment raised member 110 is any one of a cone, a cylinder, a pin, a fin, a dome, a prism, and combinations thereof. The shape of raised member 110 may be suitably selected to provide the best possible thermal coupling for the available space and the targeted cooling performance. For instance, a pin or a cylinder may be selected if cavity 112 has a regular horizontal cross-section (e.g., circular or square), whereas a fin may be more suitable for cavity 112 with a rectangular horizontal cross-section to gain a larger contact area between raised member 110 and guiding structure 106.

The mentioned shapes may also be advantageously combined with each other. Examples include a cylinder with a dome-shaped tip, which may facilitate insertion or reinsertion of raised member 110 into guiding structure 106 during assembly or for changing usage scenarios, or a slightly conical prism, which may provide a robust mechanical and thermal contact to guiding structure 106 as the pressure applied on heat sink 100 for mounting is converted to horizontal component forces which press the flat prism surfaces of raised member 110 and guiding structure 106 firmly against each other.

According to an embodiment, the coefficient of thermal expansion of raised member 110 exceeds the coefficient of thermal expansion of guiding wall 104. Heat sink 100 is usually installed on the at least one electronic component in a cold state. When the electronic component heats up, the heat will spread through flexible element 108 into raised member 110, causing raised member 110 to grow vertically and horizontally. The vertical growth of raised member 110 may increase the contacting surface with guiding structure 106, while horizontal growth may cause raised member 110 to exert a vertical force on guiding structure 106, thus closing microscopic gaps and providing a firmer mechanical and thermal contact to body 102.

According to an embodiment, the material of any one of raised member 110 and flexible element 108 comprises any one of: Cu and an alloy based on Mg, Zn, Al, Si, SiC, or W. The mentioned materials may ensure a high cooling performance of heat sink 100 by providing a heat path with a high thermal conductivity.

Guiding structure 106, as used herein, is a part located at the ceiling of cavity 112, opposing flexible element 108 and facing raised member 110. Guiding structure 106 provides an opening towards flexible element 108, as well as guiding wall 104 for receiving and contacting raised member 110 as it moves in moving direction 120. One guiding structure 106 always forms a pair with one raised member 110. If only one pair of guiding structure 106 and raised member 110 is present, it is preferably horizontally centered with cavity 112. Preferably, guiding structure 106 is permanently receiving raised member 110 to provide an initial contact length between raised member 110 and guiding structure 106 when flexible element 108 is unstrained or in a deflection away from ceiling of the cavity 112.

Guiding wall 104 may be subdivided into more than one segment. The top of guiding structure 106 may not necessarily be aligned with the ceiling, but it should offer sufficient vertical space such that raised member 110 does not touch the top for the largest expectable unevenness of the cooling surface of the at least one electronic component. The horizontal structure of guiding wall 104 should fit the contour of raised member 110. Guiding structure 106 may be formed as one part with body 102, or alternatively, it may be part of a separate piece which is connected to body 102 after cavity 112, raised member 110 and flexible element 108 have been formed as one semi-finished product.

Guiding structure 106 furthermore serves the purpose to spread the heat transported from the at least one electronic component through flexible element 108 and raised member 110 into the heat spreading section or plate of body 102. The inner surfaces of guiding wall 104 are preferably smooth as to provide a good thermal coupling on a microscopic scale.

According to an embodiment, guiding wall 104 of guiding structure 106 is protruding into cavity 112. This may allow for designing body 102 with a thinner heat spreading section as no additional heat path length is created, as would be the case if guiding structure 106 were extending beyond the cavity ceiling into body 102. In FIGS. 1-3, guiding wall 104 is shown with two protruding rectangular segments whose width is comparable to the width of raised member 110. Providing guiding wall 104 with a width of at least half the width of raised member 110 may prevent a bottleneck due to insufficient heat conduction in the central heat path. Preferably, guiding wall 104 is dimensioned between 100 and 2000 µm. Selecting too small of a width for guiding wall 104 may diminish the thermal transport capability of guiding structure 106.

According to an embodiment, guiding wall 104 is bendable in bending direction 122 perpendicular to moving direction 120 of raised member 110. This may allow for guiding wall 104 to adapt to the thermal expansion of raised member 110. Furthermore, bendable guiding wall 104 can be pressed against raised member 110 to ensure a robust thermal contact. As described below, the external force necessary to bend guiding wall 104 against raised member 110 may be generated by thermal expansion of a secondary material present in cavity 112.

Another advantage of bendable guiding wall 104 may be that sticking of guiding structure 106 and raised member 110 may be avoided when heat sink 100 is removed from the electronic component. The bendability of guiding wall 104 is preferably of an elastic nature. This may allow for repeated usage of compliant heat sink 100 with different electronic components, where heat sink 100 may undergo more than one cycle of installing and uninstalling. Bendability of guiding wall 104 is dependent on a selection of a width within a specified range. A maximum width of 2000 µm is deemed feasible to prevent usage limitations due to unnecessary rigidity of guiding wall 104.

FIGS. 1-3 show different scenarios of creating a strong thermal link between raised member 110 and guiding structure 106 by means of producing them from materials with mismatched thermal expansion coefficients. In FIGS. 1 and 2, raised member 110 is made of a material with a higher thermal expansion coefficient than body 102. During usage, heat will spread into raised member 110, causing it to expand thermally and exert a horizontal force on guiding structure 106, thus strengthening the thermal coupling in the central heat path.

FIG. 3 depicts a schematic cut through a compliant heat sink, the guiding structure being part of an insert, in accordance with an embodiment of the present invention.

In FIG. 3, however, body 102, flexible element 108, and raised member 110 are made, as one piece from the same material and guiding structure 106 is part of insert 300, which is connected to the sidewalls of cavity 112. For example, insert 300 may be soldered or welded with body 102, but other connections like a threaded joint are also possible. In FIG. 3, insert 300 comprising guiding structure 106 is made of a material with a higher thermal expansion coefficient than body 102. As heat spreads through heat sink 100 during usage, the dimensions of insert 300 will grow relative to the framework of body 102 and also raised member 110. This may likewise improve the thermal coupling between raised member 110 and guiding structure 106, but care should be taken that the thermal expansion of insert 300 does not adversely affect structure of the body 102. This may, for instance, be achieved by designing body 102 with horizontal interconnections out of the image plane, which provide a sufficient rigidity against thermal expansion of insert 300, or by using a threaded joint with sufficient tolerance for connecting insert 300 to body 102.

In general, raised member 110 should be manufactured with a width between 10% and 40% of the cavity width. As mentioned before for guiding structure 106, a too narrow raised member 110 might yield insufficient heat transport capability to provide a necessary cooling power, which is expected to range up to 1 kW, while too large a raised member 110 may deteriorate the elasticity of flexible element 108.

Figure 4:
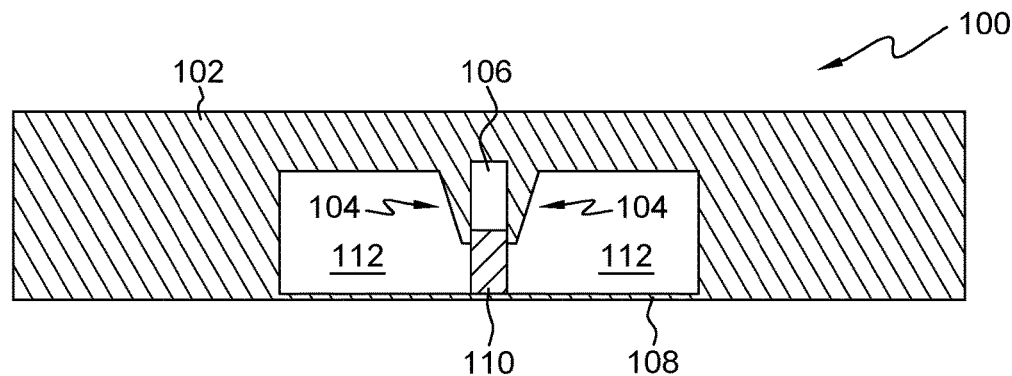
FIG. 4 depicts a schematic cut through a compliant heat sink with a tapered guiding wall, in accordance with an embodiment of the present invention.

FIG. 4 depicts a schematic cut through a compliant heat sink with a tapered guiding wall, in accordance with an embodiment of the present invention.

According to an embodiment, the guiding wall 104 comprises a tapering towards the flexible element 108. FIG. 4 shows a schematic cut through an exemplary heat sink 100, where raised member 110 is made of a material with a different coefficient of thermal expansion than guiding structure 106 and guiding wall 104 comprises a tapering towards flexible element 108. The tapering direction towards flexible element 108 means that the thickness of guiding wall 104 is smallest at the tip, which is facing flexible element 108.

As a consequence, sections of guiding wall 104 which are in contact with raised member 110 may be more flexible in bending direction 122 perpendicular to moving direction 120 of raised member 110, while the rigidity and the thermal coupling of guiding structure 106 with the bulk of body 102 increases towards the ceiling of cavity 112 due to the larger thickness in this region. Tapered guiding wall 104 may therefore provide an improved adaptability to thermal expansion of raised member 110 and high heat conductivity towards body 102 at the same time. If heat sink 100 is implemented with expansion layer 500 as described further below, the thin part of guiding wall 104 may analogously respond more flexibly to thermal expansion of expansion layer 500.

According to an embodiment, heat sink 100 further comprises expansion layer 500, where expansion layer 500 adjoins at least part of guiding wall 104 and a surface of body 102 opposite to guiding wall 104, and where expansion layer 500 further has a larger coefficient of thermal expansion than body 102.

Figure 5:
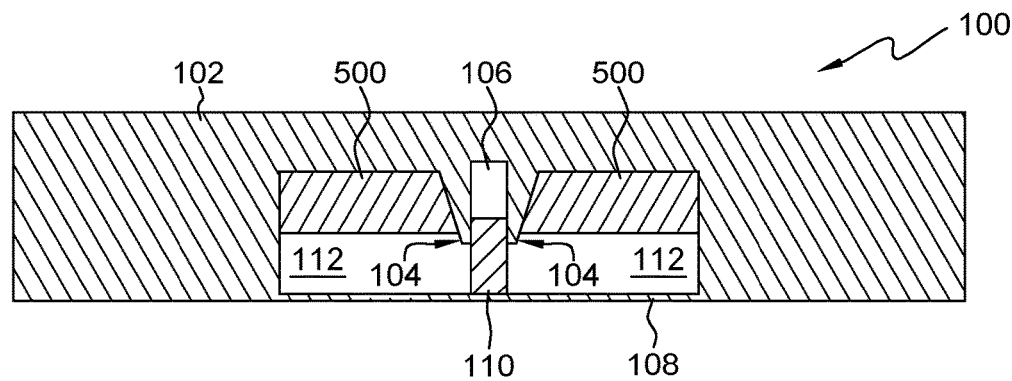
FIG. 5 depicts a schematic cut through a compliant heat sink with an expansion layer being present in the cavity, in accordance with an embodiment of the present invention.

FIG. 5 depicts a schematic cut through a compliant heat sink with an expansion layer being present in the cavity, in accordance with an embodiment of the present invention.

FIG. 5 shows the schematic cut of FIG. 4 with the difference that raised member 110 and flexible element 108 are made of the same material and that expansion layer 500 is deposited at the ceiling of cavity 112 in a manner that it fills the space between tapered guiding wall 104 and sidewalls of cavity 112, while guiding structure 106 encompassed by guiding wall 104 is free from the expansion layer material to provide vertical space for guiding movement of raised member 110 in moving direction 120. Due to a larger coefficient of thermal expansion compared to body 102, expansion layer 500 may exert a horizontal force on guiding wall 104, pressing it tighter onto raised member 110. Expansion layer 500 receives the heat causing the expansion primarily from body 102. A gas or vapor atmosphere in the chamber assist this process, which provides a shorter thermal path between flexible element 108 and expansion layer 500.

Figure 6:
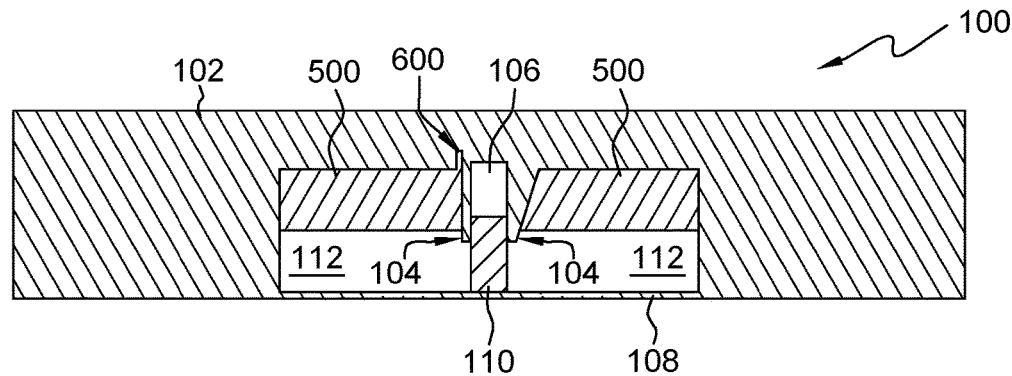
FIG. 6 depicts a schematic cut through a compliant heat sink with a groove adjoining the guiding wall, in accordance with an embodiment of the present invention.
Figure 7:
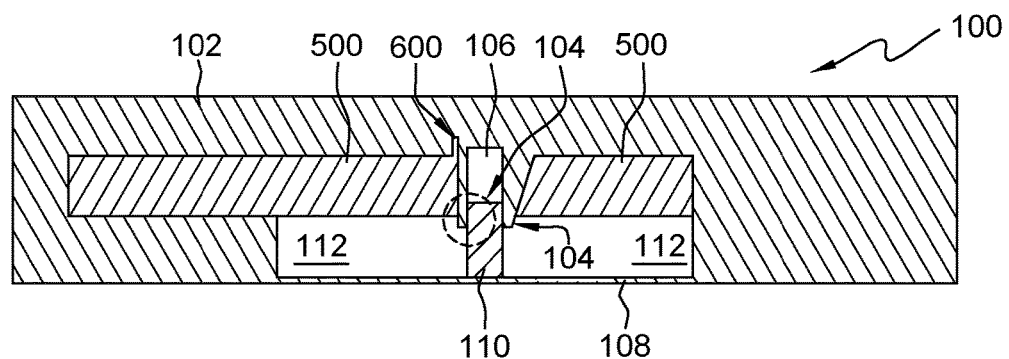
FIG. 7 depicts a schematic cut through a compliant heat sink, the expansion layer extending into a slot in the body, in accordance with an embodiment of the present invention.

Generating external pressure on guiding wall 104 may reduce the size of microscopic gaps between raised member 110 and guiding wall 104 caused by surface unevenness. Hence, expansion layer 500 may improve a poor initial thermal contact caused by surface roughness of the parts in the central heat path in a cold state of heat sink 100. As can be seen in FIGS. 5-7, expansion layer 500 preferably covers the cavity ceiling with a thickness, which is comparable to the length or height of guiding wall 104 or the different sections. It is formed from a suitable solid material with a larger coefficient of thermal expansion than body 102, including metals and metal alloys, but also non-metallic materials such as epoxy compounds.

According to an embodiment, at least part of guiding wall 104 is elongated by a groove 600, which immediately adjoins guiding wall 104 and extends into body 102. Groove 600 is understood here as a pit extending along guiding wall 104 or at least one of the segments.

FIG. 6 depicts a schematic cut through a compliant heat sink with a groove adjoining the guiding wall, in accordance with an embodiment of the present invention.

FIGS. 6 and 7 show a cut through an exemplary heat sink 100, where guiding wall 104 comprises one section with a tapering towards flexible element 108 and another thin section with a rectangular cross-section, body 102, guiding structure 106, flexible element 108 and raised member 110 are formed from the same material, expansion layer 500 is present at the ceiling of cavity 112, and the thin section of guiding wall 104 is prolonged outside of the gap receiving raised member 110 by groove 600 immediately adjoining the thin section of guiding wall 104 and extending into the ceiling. Such gap may increase the bendability of the thin guiding wall section by reducing surface strain when exerted to vertical force generated by expansion layer 500.

Dividing guiding wall 104 into a thin and a tapered part as shown in FIGS. 6 and 7 may enable the formation of a tighter thermal-mechanical contact between raised member 110 and guiding structure 106 and thus further increase the heat transport performance of heat sink 100 through the central heat path.

FIG. 7 depicts a schematic cut through a compliant heat sink, the expansion layer extending into a slot in the body, in accordance with an embodiment of the present invention.

According to an embodiment, expansion layer 500 extends into slot 700 in body 102 opposite to guiding wall 104. FIG. 7 shows a cut through a similar heat sink 100 as that shown in FIG. 6, the difference being that slot 700 is formed along the ceiling into one of the sidewalls of cavity 112 and expansion layer 500 extends into slot 700 such that it is completely filled by the expansion layer material. Expansion layer 500 enlarged this way may provide for a sufficiently large thermal expansion of expansion layer 500 to form a tight thermal-mechanical connection between guiding structure 106 and raised member 110 even when the temperature difference between the at least one electronic component to be cooled and a coolant outside of heat sink 100 (e.g., ambient air or a heat transfer liquid) is small.

As an example, the highest operating temperature is 80° C. for many electronic components and a cooling air temperature is typically 30° C. In this example, an operating state with a low temperature difference would feature an electronic component temperature of, e.g., 50° C. Heat sink 100 providing a high cooling power also in this state could enable a high-performance operation of the electronic component over a longer time until it reaches temperature maximum. Moreover, a prolonged expansion layer 500 may provide support for rapid temperature changes of the electronic component because the heat causing thermal expansion of expansion layer 500 reaches the expansion layer material over a shorter path and through an increased surface area, and therefore high cooling performance may be provided also for electronic components which are frequently subject to strong variations in workload or performance.

According to an embodiment, guiding structure 106 further comprises a friction lowering coating interfacing guiding structure 106 and raised member 110. According to an embodiment, guiding structure 106 further comprising a heat conducting coating interfacing guiding structure 106 and raised member 110.

A friction lowering coating may be any liquid, viscous or solid material (e.g., a grease, oil or powder), which is capable of compensating the surface roughness of raised member 110 and guiding structure 106. A heat conducting coating may be any liquid, viscous, or solid material, which is capable of increasing thermal conduction between guiding structure 106 and raised member 110 by providing an interface with a high thermal conductivity, compared to dry metal-metal contact.

A friction lowering coating and a heat conducting coating may be different materials used at the same time. For instance, the two coatings may be two immiscible gels or a suspension like thermal grease, which comprises the friction lowering coating and the heat conducting coating. However, a single coating material 800 may provide the functions of both coatings as well. Such dual-purpose coating material 800 is preferably selected from the group of carbon or carbon fiber-based materials, two non-exhaustive examples being graphite or carbon nanotubes (CNTs).

Another advantage of using a friction lowering coating may be the capability to facilitate vertical relaxation of flexible element 108 and raised member 110 upon relief of heat sink 100 from the electronic component. For this purpose, a friction lowering coating with a high thermal stability is preferably used.

Figure 8A:
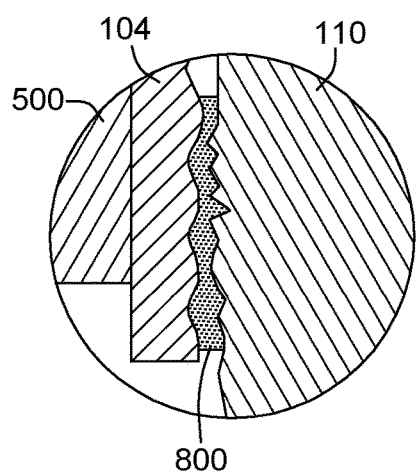
FIG. 8A depicts a coating interfacing the guiding structure and the raised member in cold state, in accordance with an embodiment of the present invention.

FIG. 8A depicts a coating interfacing the guiding structure and the raised member in cold state, in accordance with an embodiment of the present invention.

Figure 8B:
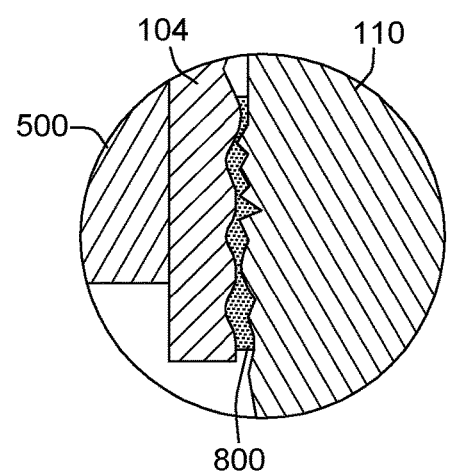
FIG. 8B depicts a coating interfacing the guiding structure and the raised member in heated-up state, in accordance with an embodiment of the present invention.

FIGS. 8A and 8B shows a detail from FIGS. 6 and 7, where the surface roughness of guiding structure 106 and raised member 110 is visible. The microscopic gap between raised member 110 and guiding structure 106 is partially filled with coating material 800 depicted as a black area. Coating material 800 extends into the irregularities of the two adjoining surfaces. In FIG. 8A, heat sink 100 is in a cold state, e.g., after installation of heat sink 100 on the electronic component, but before the electronic component is switched on. FIG. 8B depicts a coating interfacing the guiding structure and the raised member in heated-up state, in accordance with an embodiment of the present invention.

In FIG. 8B, heat sink 100 is heated up and expansion layer 500 is extended thermally, pressing guiding wall 104 against raised member 110. It is seen from FIGS. 8A and 8B that merely parts of the adjoining surfaces form a metal-to-metal contact with a high thermal conductivity. By spreading into the microscopic surface structure of the two interfacing parts, coating 800 provides a thermal coupling between surface regions, which are not contactable by purely mechanical means. Coating 800 may therefore increase thermal conductivity of the central heat path by increasing the active heat transfer surface of the mechanical contact between raised member 110 and guiding structure 106. In FIGS. 8A and 8B, coating 800 is shown as an elastic material which does not significantly spread along the two adjacent surfaces upon actuation of guiding wall 104. It is understood however that the coating 800 may be inelastic and move vertically if the gap between raised member 110 and guiding structure 106 is deformed horizontally.

The compliant heat sink 100 may advantageously be used to cool more than one electronic component in parallel. The two embodiments described in the following are envisioned to provide this capability. According to an embodiment, cavity 112, flexible element 108, raised member 110 and guiding structure 106 form a heat transfer unit which comprises a single one of body 102 and multiple ones of the heat transfer unit. According to an embodiment, raised member 110 and guiding structure 106 form a heat transfer unit which comprises a single one of body 102, a single one of cavity 112, a single one of the flexible element 108, and multiple ones of the heat transfer unit.

Cooling more than one electronic component in parallel may be accomplished by using multiple heat transfer units. In the first case, body 102 comprises multiple cavities, wherein each cavity 112 is equipped with a flexible element 108, a raised member 110, and a guiding structure 106 and is adapted for providing high performance heat transfer for one of the multiple electronic components. In the other case, only one cavity 112 covered by a flexible element 108 is present in body 102, but it comprises multiple heat transfer paths, each comprising a raised member 110 and guiding structure 106.

Embodiments under the first case may be more advantageous if the plurality of electronic components spreads over a large footprint area, while embodiments under the second case may be more advantageous if the plurality of electronic components has merely small differences in form factor. Embodiments under both cases may be advantageous if the amount of available space is insufficient to use multiple heat sinks 100 comprising merely one heat transfer unit in parallel.

The compliant heat sink 100 may form a cool-able electronic system together with at least one electronic component to be cooled. According to an embodiment of the cool-able electronics system, the at least one electronic component comprises a semiconductor die with a curved surface and the thermal coupling is a thermal coupling of the die to heat sink 100.

Advantages of this system shall be demonstrated with the following example. A large-area semiconductor die has a thermal envelope which allows for a maximum operational temperature of 85° C. and exhibits a convex curvature to the heat sink 100. Using a package with a flat lid, a sufficiently strong thermal coupling can only be achieved in a central area of the bulge. Heat generated at the boundaries of the semiconductor die spreads towards the heat sink 100 through a second bond line of thermal interface material and through the semiconductor itself into a central region, where higher cooling power is available. In order to maintain all regions of the die below maximum operational temperature, the ambient air of the system must be maintained at 30° C. to keep the die's essential region at 80° C., allowing for a temperature gradient within the die of 5° C.

If the semiconductor die, however, is part of the mentioned cool-able electronic components, the flexible element 108 may adapt to the convex surface structure of the die, providing a more uniform heat transport for all regions of the die. An ambient air temperature of 35° C. may be used to keep the die temperature at 80° C. throughout, which may beneficially reduce the power requirement for air conditioning. Furthermore, a larger heat tolerance may be created for operating the semiconductor die, which may substantially reduce the risk of overheating.

What is claimed is:

1. A compliant heat sink for transporting heat away from at least one electronic component, the heat sink comprising:
a body, wherein the body includes a flexible element thermally contacting at least one electronic component;
a cavity located in the body, wherein the cavity is at least partially covered by the flexible element;
a raised member of the body coupled to the flexible element, wherein a portion of the raised member partially extends into the cavity; and
a guiding structure of the body coupled in the cavity of the body, wherein the guiding structure is adapted for guiding the movement of the raised member in a moving direction, wherein the guiding structure includes a guiding wall protruding into the cavity.

2. The heat sink of claim 1, wherein the guiding wall is bendable in a bending direction perpendicular to the moving direction.

3. The heat sink of claim 2, further comprising:
an expansion layer, wherein the expansion layer is coupled to at least part of the guiding wall and a surface of the body opposite to the guiding wall, wherein the expansion layer includes a larger coefficient of thermal expansion than the body.

4. The heat sink of claim 3, wherein the expansion layer extends into a slot in the body opposite to the guiding wall.

5. The heat sink of claim 1, wherein at least part of the guiding wall is elongated by a groove, the groove immediately coupled to the guiding wall and extending into the body.

6. The heat sink of claim 1, wherein the guiding wall includes a tapering towards the flexible element.

7. The heat sink of claim 1, wherein the cavity is filled with any one of the following: air, nitrogen, methanol vapor, ethanol vapor, and an arbitrary combination thereof.

8. The heat sink of claim 1, wherein a pressure within the cavity exceeding an ambient air pressure of the heat sink.

9. The heat sink of claim 1, the guiding structure further comprises:
a friction lowering coating, wherein the friction lowering coating interfaces with the guiding structure and the raised member.

10. The heat sink of claim 1, the guiding structure further comprises:
a heat conducting coating, wherein the heat conducting coating interfaces with the guiding structure and the raised member.

11. The heat sink of claim 1, wherein the raised member being any one of: a cone, a cylinder, a pin, a fin, a dome, a prism, and combinations thereof.

12. The heat sink of claim 1, wherein a coefficient of thermal expansion of the raised member exceeds a coefficient of thermal expansion of the guiding wall.

13. The heat sink of claim 1, wherein the material of any one of the raised member and the flexible element comprising any one of: Cu and an alloy based on Mg, Zn, Al, Si, SiC, or W.

14. The heat sink of claim 1, further comprising:
an air-cooling component for exchanging heat with ambient air of the body, the air-cooling component being thermally coupled to the body, and
a liquid-cooling component for exchanging heat with a heat transport liquid, the liquid-cooling component being thermally coupled to the body.

15. The heat sink of claim 1, wherein the cavity, the flexible element, the raised member and the guiding structure form a heat transfer unit.

16. The heat sink of claim 1, wherein the raised member and the guiding structure form a heat transfer unit.

* * * * *